United States Patent
Gallagher et al.

[19]

[11] Patent Number: 5,948,533
[45] Date of Patent: *Sep. 7, 1999

[54] VERTICALLY INTERCONNECTED ELECTRONIC ASSEMBLIES AND COMPOSITIONS USEFUL THEREFOR

[75] Inventors: Catherine A. Gallagher, San Marcos; Goran S. Matijasevic, San Clemente; Pradeep Gandhi, Del Mar; M. Albert Capote, Carlsbad, all of Calif.

[73] Assignee: Ormet Corporation, Carlsbad, Calif.

[ * ] Notice: This patent is subject to a terminal disclaimer.

[21] Appl. No.: 08/813,809

[22] Filed: Mar. 6, 1997

Related U.S. Application Data

[63] Continuation-in-part of application No. 08/483,079, Jun. 7, 1995, Pat. No. 5,716,663, and application No. 08/188,658, Jan. 26, 1994, Pat. No. 5,538,789, which is a continuation of application No. 07/903,042, Jun. 23, 1992, abandoned, which is a continuation-in-part of application No. 07/769,892, Oct. 1, 1991, Pat. No. 5,376,403, said application No. 08/483,079, is a continuation-in-part of application No. 08/324,060, Oct. 17, 1994, Pat. No. 5,830,389, which is a division of application No. 07/769,892, Oct. 1, 1991, Pat. No. 5,376,403, which is a continuation-in-part of application No. 07/477,678, Feb. 9, 1990, abandoned.

[51] Int. Cl.⁶ .............................. H01B 1/02; H01B 1/22
[52] U.S. Cl. .......................... 428/418; 428/413; 428/458; 428/901; 252/513; 252/514; 252/518; 174/255; 174/257; 174/265
[58] Field of Search ................................ 428/413, 418, 428/458, 901; 252/513, 514, 518; 174/255, 257, 265

[56] References Cited

U.S. PATENT DOCUMENTS

| | | | |
|---|---|---|---|
| 3,541,222 | 11/1970 | Parks et al. | 174/261 |
| 3,791,858 | 2/1974 | McPherson et al. | 117/201 |
| 3,835,531 | 9/1974 | Luttmer | 29/625 |
| 3,939,559 | 2/1976 | Fendly et al. | 29/628 |
| 3,953,924 | 5/1976 | Zachry et al. | 29/625 |
| 3,971,610 | 7/1976 | Buchoff et al. | 174/261 |
| 4,075,757 | 2/1978 | Malm et al. | 29/625 |
| 4,159,222 | 6/1979 | Lebow et al. | 156/632 |
| 4,273,593 | 6/1981 | Mastrangelo | 148/24 |
| 4,285,780 | 8/1981 | Schachter | 204/15 |
| 4,306,925 | 12/1981 | Lebow et al. | 156/150 |
| 4,331,286 | 5/1982 | Miyazaki et al. | 228/198 |
| 4,332,341 | 6/1982 | Minetti | 228/180 |
| 4,383,363 | 5/1983 | Hyakawa et al. | 29/847 |
| 4,446,477 | 5/1984 | Currie et al. | 357/74 |
| 4,478,882 | 10/1984 | Roberto | 427/97 |
| 4,519,760 | 5/1985 | Norell | 425/113 |
| 4,634,631 | 1/1987 | Gazit et al. | 428/421 |
| 4,640,866 | 2/1987 | Suzuki | 428/422 |
| 4,642,160 | 2/1987 | Burgees | 156/630 |
| 4,645,733 | 2/1987 | Sullivan | 430/314 |
| 4,647,508 | 3/1987 | Gazit et al. | 428/421 |
| 4,661,204 | 4/1987 | Mathur et al. | 156/656 |
| 4,667,220 | 5/1987 | Lee et al. | 357/68 |

(List continued on next page.)

FOREIGN PATENT DOCUMENTS

WO 95/13901  5/1995  WIPO .......................... B23K 35/34

*Primary Examiner*—Deborah Jones
*Assistant Examiner*—Cathy F. Lam
*Attorney, Agent, or Firm*—Gray Cary Ware & Freidenrich; Stephen E. Reiter; Ramsey R. Stewart

[57] ABSTRACT

In accordance with the present invention, there are provided novel vertically interconnected assemblies and compositions useful therefore. Invention assemblies comprise substrate boards with multiple layer electronic assemblies. The multiple layers comprise individual layers of circuitry separated and adhered by dielectric materials selectively coated and/or filled with a transient liquid phase sintered (TLPS) material. The TLPS is formulated to be electrically conductive, and thereby serves to convey current between the layers of circuitry. In addition, the TLPS is easily workable so that it is amenable to automated, stepwise construction of multi-layer circuitry without the need for labor intensive drilling and filling of conductive vias.

24 Claims, 2 Drawing Sheets

U.S. PATENT DOCUMENTS

| | | | |
|---|---|---|---|
| 4,685,210 | 8/1987 | King et al. | 29/830 |
| 4,692,839 | 9/1987 | Lee et al. | 361/386 |
| 4,702,792 | 10/1987 | Chow et al. | 156/628 |
| 4,755,911 | 7/1988 | Suzuki | 361/414 |
| 4,788,766 | 12/1988 | Burger et al. | 29/830 |
| 4,810,332 | 3/1989 | Pan | 204/15 |
| 4,816,323 | 3/1989 | Inoue | 428/200 |
| 4,818,728 | 4/1989 | Rai et al. | 437/209 |
| 4,841,355 | 6/1989 | Parks | 357/82 |
| 4,849,284 | 7/1989 | Arthur et al. | 428/325 |
| 4,864,722 | 9/1989 | Lazzarini et al. | 29/830 |
| 4,868,350 | 9/1989 | Hoffarth et al. | 174/68.5 |
| 4,874,721 | 10/1989 | Kimura et al. | 437/209 |
| 4,875,617 | 10/1989 | Citowsky | 228/123 |
| 4,897,338 | 1/1990 | Spicciati et al. | 430/314 |
| 4,902,606 | 2/1990 | Patraw | 430/314 |
| 4,908,940 | 3/1990 | Amano et al. | 29/852 |
| 4,915,983 | 4/1990 | Lake et al. | 427/98 |
| 4,921,777 | 5/1990 | Fraenkel et al. | 430/314 |
| 4,922,377 | 5/1990 | Matsumoto et al. | 361/387 |
| 4,926,241 | 5/1990 | Carey | 357/75 |
| 4,954,313 | 9/1990 | Lynch | 419/9 |
| 4,958,258 | 9/1990 | Charruau | 361/386 |
| 4,967,314 | 10/1990 | Higgins, III | 361/414 |
| 4,995,941 | 2/1991 | Nelson et al. | 156/630 |
| 5,008,997 | 4/1991 | Phy | 29/827 |
| 5,010,641 | 4/1991 | Sisler | 29/830 |
| 5,023,921 | 6/1991 | Goutte et al. | 382/58 |
| 5,030,499 | 7/1991 | Shaheen et al. | 428/137 |
| 5,031,308 | 7/1991 | Yamashita et al. | 29/830 |
| 5,046,238 | 9/1991 | Daigle et al. | 29/830 |
| 5,049,974 | 9/1991 | Nelson et al. | 357/70 |
| 5,055,425 | 10/1991 | Leibovitz et al. | 437/195 |
| 5,061,548 | 10/1991 | Arthur et al. | 428/209 |
| 5,072,075 | 12/1991 | Lee et al. | 174/264 |
| 5,097,393 | 3/1992 | Nelson et al. | 361/386 |
| 5,129,142 | 7/1992 | Bindra et al. | 29/852 |
| 5,274,912 | 1/1994 | Olenick et al. | 29/830 |
| 5,276,955 | 1/1994 | Noddin et al. | 29/593 |
| 5,309,629 | 5/1994 | Transkos et al. | 29/830 |
| 5,329,695 | 7/1994 | Transkos et al. | 29/830 |
| 5,376,403 | 12/1994 | Capote et al. | 427/96 |
| 5,440,805 | 8/1995 | Daigle et al. | 29/830 |
| 5,498,467 | 3/1996 | Meola | 428/901 |
| 5,538,789 | 7/1996 | Capote et al. | 428/901 |
| 5,703,405 | 12/1997 | Zeber | 257/723 |
| 5,716,663 | 2/1998 | Capote et al. | 427/96 |

VERTICALLY INTERCONNECTED ELECTRONIC ASSEMBLIES AND COMPOSITIONS USEFUL THEREFOR

RELATED APPLICATIONS

This application is a continuation-in-part of Ser. No. 08/483,079, filed Jun. 7, 1995, now U.S. Pat. No. 5,716,663, which is a continuation-in-part of Ser. No. 08/324,060, filed Oct. 17, 1994, now U.S. Pat. No. 5,830,389, which is a divisional of Ser. No. 07/769,892, filed Oct. 1, 1991, now U.S. Pat. No. 5,376,403, which is a continuation in part of Ser. No. 07/477,678, filed Feb. 9, 1990, now abandoned, the entire contents of each of which are hereby incorporated by reference herein. This application is also a continuation-in-part of Ser. No. 08/188,658, now U.S. Pat. No. 5,538,789, filed Jan. 26, 1994, which is a continuation of Ser. No. 07/903,042, filed Jun. 23, 1992, now abandoned, which is a continuation-in-part of Ser. No. 07/769,892, filed Oct. 1, 1991, now U.S. Pat. No. 5,376,403, as referenced above, the entire contents of each of which are hereby incorporated by reference herein.

FIELD OF THE INVENTION

The present invention relates to vertically interconnected electronic assemblies (i.e., "vias") useful for electronic packaging. More particularly, this invention relates to structures prepared employing transient liquid phase sintering conductive adhesive compositions. The structures prepared using these compositions may be employed in the preparation of multilayer printed circuit boards as well as other multilayer structures where a patterned vertical electrical interconnection is needed (e.g., connectors, semiconductor chips, area array packages, and the like).

BACKGROUND OF THE INVENTION

Multilayer printed wiring boards (PWB's) are generally known. See, for example, U.S. Pat. Nos. 4,921,777, 4,897,338, 4,642,160, 4,645,733, and 3,791,858. Prior art methods of fabricating multilayer PWB's, however, are deficient in a number of respects. In particular, as related to the fabrication of multilayer printed circuits requiring high circuit densities, prior art methods are deficient in a number of respects, especially with regard to methods to accomplish vertical electrical interconnection.

There are currently a number of technology drivers for the development of improved vertical interconnection materials and processes. As the PWB industry increasingly shifts from through-hole to surface mount for components, vias are becoming nothing more than a means for vertical interconnection. In addition, the rapid growth of the portable electronics industry and its need for sophisticated, small form factor components and modules in high volume has created a requirement for novel, high density vertical interconnect techniques. In the past, the relatively small market for products with this level of sophistication has been fulfilled by ceramic and deposited thin-film technologies. These techniques do not, however, have the infrastructure, cost-effectiveness or compatibility with low cost materials to address the consumer market as effectively as the PWB industry. Conversely, conventional PWB technology cannot address the high density requirements cost-effectively or in high yield because of limitations in registration, resolution capabilities of print-and-etch technology and the short life span of drill bits less than 6 mil in diameter.

Via holes in PWB's are typically mechanically drilled and plated. In conventional PWB design they are used to provide a site of attachment and interconnection for through-hole components, to electrically interconnect the front and back sides of a double sided circuit, and to route connections from the innerlayers of a multilayer circuit board. Due to the geometries involved and the nonuniform surface of resin and exposed reinforcement, these through-hole vias are difficult to metallize relative to surface circuit traces. Drilling vias through a stacked multilayer PWB wastes valuable real estate because of the sizes of vias that can be cost-effectively drilled, the large capture pads required for high yields and the lost space on layers that do not require interconnection at all points drilled. Because of this, vertical interconnection on a layer-to-layer basis is gaining popularity in multilayer PWB fabrication. Indeed, tiny microvias are now being formed using such techniques as laser, photolithography and plasma etching. There is a need in the art for materials and technologies which enable one to fill these microvias with conductors that can reliably interconnect conventional circuit layers.

The currently available methods for making layer-to-layer vertical electrical interconnection include various strategies employing conductive polymer thick film inks, solder filling, anisotropic adhesives, electroless plating, and a number of direct metallization techniques utilizing carbon, palladium and plasma deposited seed layers. Of all these processes, only the first three are utilized to directly plug the via. All the others require an electrolytic plating step to achieve the desired barrel thickness or plug.

Polymer thick film inks (PTF's) are typically screen- or stencil-printed into vias using the techniques and concepts employed in the ceramic substrate industry. These materials offer a simple two step process of fill and cure. While PTF's afford process simplicity, high density, low cost and and low process temperature, they also suffer from poor reliability and inadequate performance, as detailed in U.S. Pat. No. 5,376,403, incorporated by reference herein in its entirety.

Solder jetting and solder paste stenciling are currently employed in via filling for select applications. Obviously, stacking balls in vias one-by-one, as required in solder jetting, is a time consuming process only applicable to very high-end applications with a limited number of vias per part. Solder paste stenciling is a much more cost-effective alternative. However, the solvents and fluxes employed for solder paste stenciling have the potential to cause serious void and corrosion problems. Both approaches also suffer from reliability concerns due to potential solder remelt in subsequent assembly operations.

Anisotropically conductive film adhesives are thermoplastic polymer films that are loaded with conductive particles at a level below the percolation threshold. During assembly, the film is placed between the bare pad metallizations and pressure is applied to entrap a conductive particle between opposing bond-pads. Although the technique is attractively simple, it presents a myriad of potential problems including cross-talk from the ultra-thin bond line (<1 mil), low signal speeds and carrying capacity, fragile contacts, low thermal conductivity, potential for opens and shorts from misplaced filler particles and low chemical resistance of the thermoplastic polymer.

Electroless copper plating, the most common method for forming a seed layer on the walls of vias for subsequent electroplating, is an eight step process requiring 2–3 rinses between each step. The substrates are typically microetched with permanganate, acid cleaned, conditioned, microetched to remove conditioning agent from the outer surfaces, cleaned, catalyzed (typically with colloidal Pd-Sn), accelerated with hydrochloric acid (to expose the Pd), and finally plated. The plating solution contains a reducing agent (either formaldehyde or hypophosphite), copper salts, and a chelating agent to keep the copper salts in solution (e.g., EDTA, alkanol amines, glycolic acids, tartarates). All of the chemical processes require very stringent controls and can be adversely affected by even small levels of contaminants. Based on the process flow described herein for carrying out electroless copper plating, it can be easily discerned why metallizing vias using this technique is the lowest yield process in standard PWB manufacture. Indeed, electroless copper plating is unsurpassed in terms of both process complexity and hazardous chemical usage. The alternative methods for seed coating via walls to facillitate electroplating are generally less environmentally deleterious, but suffer from equal or greater process complexity.

An additional alternative currently available for providing a conductor for vertical interconnection is to mask all but the contact pads on the circuit layer, and electroplate to a desired pin height. This process suffers the drawback of being quite expensive. Moreover, the pins thus formed are non-compliant, resulting in deformation and piercing of upper circuit layers during lamination.

In a similar vein, integrated circuit (IC) package size has been significantly reduced by the use of area array techniques in which the input/output (I/O) pads on the bare die are connected either directly or through an interposer to the circuit board with solder columns or balls on a grid pattern. Like high density multilayer PWB's, the most efficient way to connect the bare die or its package to the redistribution circuitry is by direct vertical interconnection. Typically these types of interconnections are achieved on a joint-by-joint basis using solder, wirebonding, PTF adhesives, and the like. These joints must then be encapsulated and the spaces between them filled to achieve adequate reliability. When solder is employed, a cleaning step between these two processes may also be necessary. Both of these process steps are time consuming and not always successful. Accordingly, there exists a need in the art for a less process intensive, reliable vertical interconnection strategy for these area array type component assemblies.

OBJECTS OF THE INVENTION

It is an object of the present invention to provide specialty via structures for use in the preparation of double layer PWB's, multilayer PWB assemblies, area array electronic component assemblies, and the like.

It is another object of the invention to provide multilayer printed circuits and assemblies that have very high interconnection densities.

It is a further object of the invention to employ conductive adhesive compositions that overcome the deficiencies of the prior art for the preparation of the aforementioned specialty via structures.

It is a still further object of the invention to significantly reduce the process complexity, cost and/or process temperature associated with producing vertical electrical interconnection by conventional PWB and ceramic metallization techniques.

BRIEF DESCRIPTION OF THE INVENTION

In one aspect, the present invention is directed to a multilayer printed wiring board, the structure of which comprises a plurality of layers (a)–(c) as follows, so as to achieve the desired multiplicity of layers:

(a) a bottom circuit layer;

(b) a via interconnect layer; and (c) a top circuit layer.

Top and bottom circuit layers contemplated for use herein can be made by standard subtractive as well as novel additive circuit board fabrication techniques on a flexible or rigid, polymer, composite or metal substrate.

The via interconnect layer provided in accordance with the present invention has electrically conductive adhesive compositions patterned into suitable dielectric materials, where the suitable dielectric materials provide adhesion between the bottom circuit layer and the top circuit layer while the electrically conductive adhesive compositions provide the electrical interconnection and adhesion between connecting pads of the bottom circuit layer and the top circuit layer.

In another aspect, the present invention is directed to a multilayer printed wiring board with an attached component or die, the structure of which comprises:

(a) a single or multilayer printed wiring board substrate;

(b) a via interconnect layer which has electrically conductive adhesive compositions patterned into suitable dielectric materials, where the suitable dielectric materials provide adhesion between the printed circuit board and a component or die while the electrically conductive adhesive compositions provide the electrical interconnection and adhesion between connecting pads of the printed circuit board substrate and the attached component or die; and (c) an area array component package or bare die which is attached to the printed wiring board layer with the use of said suitable patterned dielectric materials.

The vertical electrical interconnection in invention structures is achieved by the use of conductive adhesive compositions as described in U.S. Pat. No. 5,376,403, the entire contents of which are hereby incorporated by reference herein. The electrically conductive adhesive compositions contemplated for use herein comprise a solder powder, a latent or chemically protected crosslinking agent with fluxing properties and a reactive monomer or polymer. Depending upon the intended end use, compositions contemplated for use herein comprise three or more of the following:

a relatively high melting metal powder (hereinafter, metal powder);

a lower melting point metal powder (hereinafter, solder powder);

a crosslinking agent which also serves as a fluxing agent;

a binder; and a reactive monomer or polymer.

Because such compositions are metallurgically compatible with conventional printed wiring board finishes, they can be used to create additional layers on pre-existing printed wiring boards, in specialty via structures to electrically interconnect multiple conventional printed wiring boards into multilayer constructions or attach components, and the like. The multilayer structures so produced are advantageous in several respects including providing high interconnect density, good electrical conductivity, robust metallurgical connections between the circuit layers, thin multilayer profiles, and the like, all at relatively low expense.

DETAILED DESCRIPTION OF THE INVENTION

Figure 1:
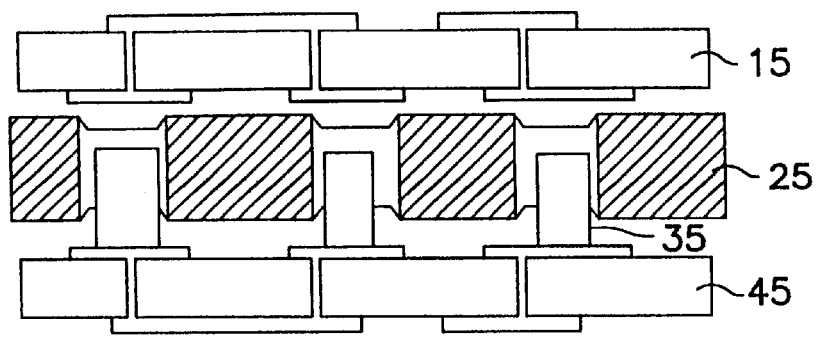
FIG. 1 is a conceptual depiction of a three-layer circuit that has a bottom circuit layer (45), a dielectric (25) containing a via interconnect layer which employs a transient liquid phase sintering conductive adhesive (35), and a top circuit layer (15).
Figure 2:
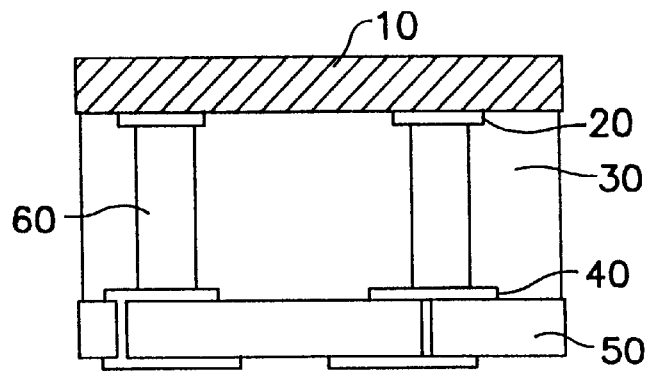
FIG. 2 is a conceptual depiction of a component (e.g., bare die 10) attached to a multilayer circuit using a via interconnect layer (60) prepared from a transient liquid phase sintering conductive adhesive. The multilayer circuit comprises copper PWB pad 40, PWB substrate 50, perforated bond-ply dielectric 30 and die I/O pad 20.
Figure 3:
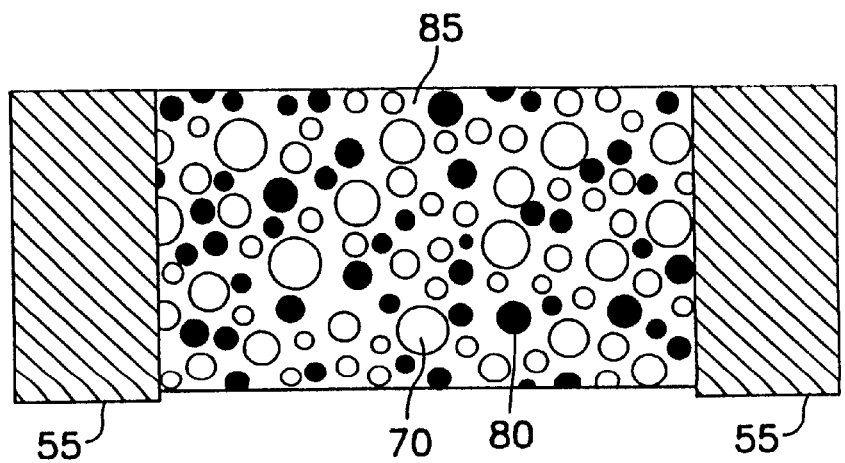
FIG. 3 is a conceptual depiction of the inventive conductive adhesive in an uncured state within a via in a perforated dielectric. In the Figure, 55 designates the dielectric, 70 designates metal particles, 80 designates alloy particles and 85 designates organic constituents of the uncured conductive adhesive.
Figure 4:
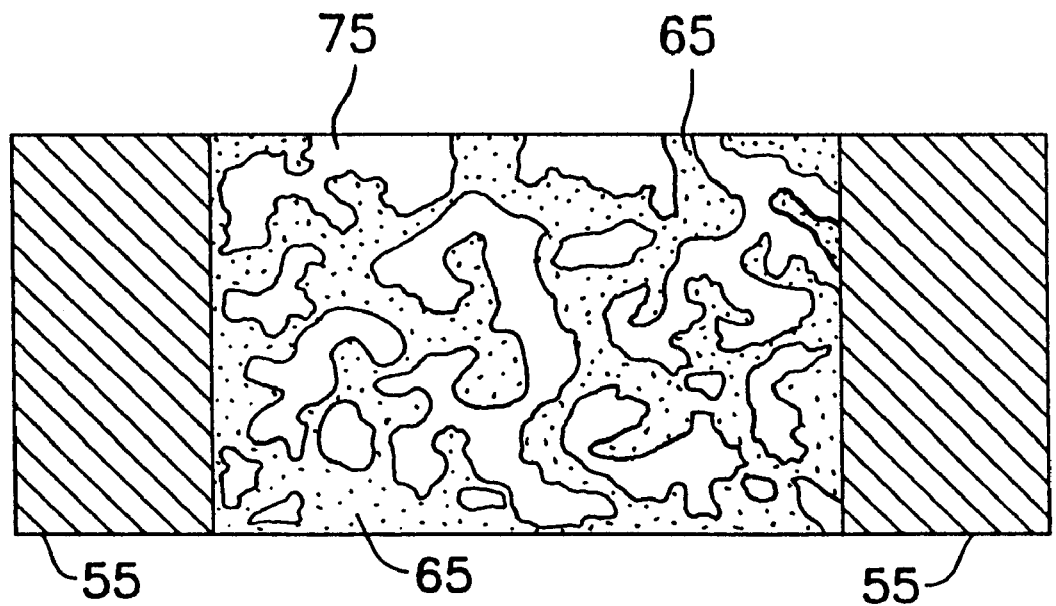
FIG. 4 is a conceptual depiction of the inventive conductive adhesive in a cured state within a via in a perforated dielectric. In the Figure, 55 designates the dielectric, 65 designates the alloyed metal network and 75 designates the polymeric network generated by crosslinking of the organic constituents of the conductive adhesive.

In accordance with the present invention, there are provided specialty vertical interconnection assembly (via) structures, said structures comprising:
(i) a dielectric material that is perforated in the desired geometries and pattern so as to form a vertical interconnection pathway; and
(ii) a defined electrically conductive transient-liquid-phase sintering (TLPS) composition filled into the holes in the perforated dielectric.

In accordance with another embodiment of the present invention, there are provided specialty via interconnect structures comprising:
(i) an encapsulated metallized dielectric, wherein the encapsulant has been selectively removed from the metallized surface in a desired pattern, and
(ii) via-posts formed from a defined electrically conductive TLPS composition within said encapsulant whereby said composition is electrically interconnected to said metallized surface.

In accordance with yet another embodiment of the present invention, there are provided specialty via structures comprising:
(i) a metallized dielectric, and
(ii) conductive adhesive posts, formed from a defined electrically conductive adhesive TLPS composition, in contact with said metallized dielectric in a desired via configuration.

Conductive adhesive compositions contemplated for use in the practice of the present invention comprise two primary components:
a low melting point metal (or metal alloy powder), and
a crosslinking agent comprising a latent or protected curing agent, which also acts as a primary fluxing agent.

Depending upon the intended end use, the preferred compositions of the invention contain three or more of the following:
(1) A low melting point metal or metal alloy powder (solder);
(2) A crosslinking agent comprising a latent or protected curing agent, which also acts as a primary fluxing agent;
(3) Optionally, a high melting point metal or metal alloy powder;
(4) Optionally, a binder;
(5) Optionally, a reactive monomer or polymer which can be crosslinked by the curing agent (hereinafter referred to as the "monomer"); and
(6) Optionally, a metal additive.

The compositions employed in the practice of the present invention frequently also contain at least one solvent; they may also contain other additives to improve certain properties such as adhesion, rheology or solderability. The composition must either contain component (4) and/or (5), or alternatively (4) and/or (5) may be combined with (2) into a single species, as in the case of a protected homopolymerizable resin.

In preparing the above-described compositions, the proportions of components (1)–(6) may be varied over a considerable range and once cured still yield a suitable electrically and thermally conductive material.

Generally, the composition after curing has a bulk electrical resistivity of less than $10^{-3}$ Ohm-cm. This electrical conductivity range can be satisfied by numerous formulations having components (1)–(6) within the following ranges:

Component (1): 5–60% of the volume of the composition;
Component (2): 2–60% by volume of the composition;
Component (3): 5–65% by volume;
Component (4): 0–35% by volume;
Component (5): 0–35% by volume; and
Component (6): 0–10% by volume.

Preferably, the composition has a bulk electrical resistivity of $5 \times 10^{-5}$ Ohm-cm or less. This characteristic can be satisfied by numerous formulations having components (1)–(6) within the following ranges:

Component (1): 6–40% by volume of the composition;
Component (2): 7–50% by volume of the composition;
Component (3): 8–60% by volume;
Component (4): 0–12% by volume;
Component (5): 0–28% by volume; and
Component (6): 0–5% by volume.

The low melting point metal or metal alloy powder (1) contemplated for use herein may be Sn, Bi, Pb, Cd, Zn, Ga, In, Te, Hg, Tl, Sb, Se, Po, or the like, as well as an alloy or other metal having a melting point lower than that of the metal powder in (3). Typically, the powder has a mean particle diameter of 1–40 microns; preferably, the average particle diameter is less than or equal to the average diameter of the high melting point metal particles and the particle size distribution is substantially the same as that of the high melting point metal powder (when present). The principal requirement of the solder alloy is that it flow in the composition before the vitrification of the polymers in the composition. In order for this to occur, the solder alloy must readily wet the high melting point metal (3). For this reason, alloys of tin are ideal. Preferably, the solder powder employed in the practice of the present invention contains Sn and Pb.

The principal feature of crosslinking agent (2) is that in its unprotected form, it acts as an acid or a strong base. Most acids and strong bases function well as fluxing agents, because they can remove oxides from metals. However, if they are left in their reactive form in the composition they would prematurely cross-link the resin or be consumed in reactions with the metal powders. The principal property of a protected curing agent suitable for use in accordance with this invention is that it remains largely unreactive until it is needed to flux the metal powder and cross-link the resin. Protection may be achieved by chemically binding the agent with a chemically- or thermally-triggered species so that it becomes reactive only at or near the time that the solder powder melts. Protection may also be achieved mechanically, for example, by encapsulating the curing agent in a shell of non-reactive material which releases the curing agent only at or near the melting time of the solder powder.

Crosslinking agents (2) known in the art include anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, or other agents known to those skilled in the art to cure polymers and to be acidic or strongly basic. Protecting groups are generally specific to the curing agent employed and are not generally applicable to all curing agents. Typical protecting groups include carboxylic acids, amides, alcohols, alkyl halides, acid halides, thiols, ureas, alkyl silanes, diazoalkanes, olefins, amines, amine-ols, diamine polyols, and the like. In addition, curing agents may be protected by formation of azomethanes, acetals, ketals, transition metal complexes, or other curing agent precursors. There exist many such protecting groups and complexes specific to the curing agents being protected.

Typically, the high melting point metal or metal alloy powder (3), when present, is copper powder; however, other metals such as silver, aluminum, gold, platinum, palladium, beryllium, rhodium, nickel, cobalt, iron, molybdenum and high-melting point alloys of these metals, may alternatively be employed. Preferably, the copper powder is spherical or nearly spherical as produced by gas atomization.

The binder (4) may be any resin which can be crosslinked by the curing agent, a metal catalyst, or a hydroxyl group-bearing agent. Resins which meet this requirement include but are not limited to epoxies, phenolics, novalacs (both phenolic and cresolic), polyurethanes, polyimides, bismaleimides, maleimides, cyanate esters, polyvinyl alcohols, polyesters, polyureas, and the like. Other resin systems may be modified to be crosslinkable by the curing agent, a metal catalyst, or a hydroxyl group-bearing agent. Examples of such resins are acrylics, rubbers (butyl, nitrile, etc.), polyamides, polyacrylates, polyethers, polysulfones, polyethylenes, polypropylenes, polysiloxanes, polyvinyl acetates/polyvinyl esters, polyolefins, cyanoacrylates, polystyrenes, and the like. Typically, any resin would function in this invention if the resin can be modified to contain at least one of the following functional groups: anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, sulfonic esters/acids or other functional groups known to those skilled in the art to act as reactive sites for polymerization. For example, a polyolefin would not be suitable as a resin in this invention, as it has no reactive sites for binding and has poor adhesive properties; however, a carboxylated polyolefin functions well when matched with a suitable crosslinking agent. A combination of these and other resins, such as non-crosslinkable thermoplastic resins, may also be used as component (4). Presently preferred is a multifunctional epoxy resin, combined with a phenolic based epoxy resin.

The monomers (5) contemplated for use herein may be any species, monomeric or polymeric, which may be crosslinked by the curing agent, a metal catalyst, or a hydroxyl group-bearing agent. Generally, they are distinguished from binders by having relatively low molecular weights. The preferred reactive monomer (5) contains at least one functional group, and preferably two or more functional groups, as reactive site(s) for linking with the crosslinking agents (2) and the binder (4). Typical functional groups include, but are not limited to, epoxides, amides, amines, alcohols, allyls, acrylates, methacrylates, cyanate esters, and maleimides. A preferred reactive monomer is Bisphenol A.

The optional metal additive (6) can be added as separate particles, as a coating on the high melting point metal (3) or the low melting point alloy (1), or pre-alloyed with (1) or (2). The preferred size of particulate additives is 0.1–50 $\mu$m. The metal additive can be any metal selected from boron, aluminum, chromium, iron, nickel, zinc, gallium, silver, palladium, platinum, gold, indium, antimony, bismuth, tellurium, manganese, phosphorous, cobalt, and the like Currently preferred metal additives include silver, nickel, gallium and gold.

Additives to enhance the properties of compositions suitable for use in the practice of the present invention to meet specific requirements may also be employed. Adhesion promoting agents, wetting agents, and viscosity modifiers are only a few of the additives which may be used at low levels to improve properties without significantly altering the conductivity of the final material. A variety of flexibilizing agents may also be added to these formulations.

Conductive adhesive compositions employed in the practice of the present invention have the following advantageous properties:

(a) A bulk electrical conductivity approaching that of solid copper (never achieved with prior art compositions);

(b) good solderability of the cured compositions;

(c) adhesive strengths comparable to copper-clad epoxy printed wiring board laminates;

(d) highly corrosion resistant final products with resistance to degradation at high temperatures and high relative humidities;

(e) low process temperatures compatible with polymer printed wiring board substrates; and (f) fabrication processes with significantly fewer process steps than conventional PWB fabrication methods.

Prior to the present invention, it had not heretofore been possible to achieve this combination of properties in a single composition.

The compositions used for the preparation of invention structures have many desirable characteristics. The electrical conductivity of the compositions employed in the practice of the invention is superior to the performance of conductive polymer thick films which generally incorporate high levels of silver or copper particles into a thermosetting or thermoplastic resin binder and rely upon mechanical contact of these particles to carry electrical current. In contrast to the metal content employed in PTF compositions, inventive compositions employ a combination of a high melting point metal and a relatively low melting point alloy which undergo a process known as transient-liquid-phase sintering (TLPS) to form true metallurgical joints between the metal particles.

Sintering is a well known technique used to fabricate wiring in multilayer substrates in ceramic technology. In this technique, however, process temperatures in excess of 700° C. are used to eliminate the organic binder and reduce the metal oxides for complete densification. In contrast, several metallurgical systems can undergo TLPS at temperatures well below 350° C. TLPS is characterized by raising a low melting point metal or alloy to its melting temperature at which time it diffuses into a higher melting point metal or alloy. The new alloy thus formed solidifies as it is created and has an entirely new melting point. Judicious choice of metals employed in the TLPS process can provide a composition that will remelt at substantially higher temperatures than the melting point of the original low melting point alloy. This property can readily be exploited in the practice of the present invention, thus allowing inventive compositions to be utilized in multiple sequentially processed layers and in standard soldering operations without the remelting of the originally formed metal matrix in the composition.

The adhesion properties, mechanical integrity, and corrosion resistance of the compositions employed in the practice of the present invention are far superior to those of prior art compositions, because there is no need to add aggressive fluxing agents. The compositions employed in the practice of the present invention are fully crosslinked, and all components thereof are chemically immobilized upon curing. Even the reaction by-products of the flux de-oxidation of the metals seem to be chemically bound in the polymer matrix. These compositions are ideally suited for creating the conductive vertical interconnect.

One of the methods suitable for creating a multilayer printed circuit with a vertical interconnect based on the above-described conductive adhesive TLPS formulations begins with a series of thin substrates, or bond-plys, with vias or passages created therein. The conductive composition is then applied onto each of these substrates in the desired printed circuit pattern, each layer generally being different. The compositions may then be cured, or simply dried and left uncured while the thin substrates are aligned and laminated together under pressure. The laminating pressure will force the conductive layers to interconnect through the vias and passages in the thin substrates, interconnection being made wherever the aforementioned conductive adhesive composition within the vias contacts circuit pads of the same adhesive composition on either side. Curing of the composition may be done before, during or after this laminating process. The result is a multi-layered printed circuit. Preparing multilayer structures in such a fashion is advantageous in several respects, e.g., by providing high interconnect density and thin multilayer profiles at relatively low expense.

An alternative approach is to combine conventional PWB technology with application specific via structures utilizing the above-described TLPS conductive adhesive compositions. Although there are limitations on the density of traces that can be achieved with standard print-and-etch technology, the primary determinant of multilayer circuit density are vias and their associated capture pads and routing issues. Use of the inventive compositions and methods significantly reduces this dependency. Further density increases can be achieved by employing the TLPS compositions described herein in conjunction with alternative PWB technologies such as those described in U.S. patent application No. 08/483,079, incorporated by reference herein in its entirety.

The inventive structures can be formed using perforated dielectrics which create the via patterns. The dielectric can be perforated in a variety of ways, e.g., by laser drilling, mechanical drilling, plasma, reactive ion or chemical etching, photolithography, mechanical punching, or other methods known to those skilled in the art. The vias can then be filled with the TLPS conductive adhesive formulation using a variant of conventional stencil printing techniques. Filling can be accomplished by pressure assisted or ambient pressure stenciling, individual site dispensing such as ink jet or syringe, doctor blading, or, again, by other methods known to those skilled in the art.

The conductive composition can then be optionally cured as desired. Appropriate cure regimens would be in the range of about 80–320° C. for a minimum of 5 seconds. Print resolution is limited only by the resolution of the perforated dielectric. The via layer thus created can then be aligned and laminated between two PWB's to create a multilayer printed circuit. Additional layers of circuitry and filled perforated dielectric can be laminated, as desired, to form a multilayer circuit of the desired multiplicity.

In another aspect of the invention, vertical electrical interconnect structures can be created by fabricating a conductive adhesive via-post on a metallized dielectric or circuit pad. The metallization on the dielectric can be either patterned or unpatterned and the circuit pads can refer to a PWB circuit, a redistribution circuit of a component package or a bare die. The conductive adhesive via-post can be fabricated in a number of ways that are known to those skilled in the art. In one such method, the metallization or circuit pads can be encapsulated with a polymer dielectric which is subsequently laser drilled, mechanically drilled, reactive ion or chemical etched, or photolithography defined to reveal the metal pads to which electrical interconnection is desired. Next, the TLPS conductive adhesive composition is filled into the vias and cured to an appropriate extent in the same manner as that employed in the perforated dielectric via layer technique described above.

In another method, the posts are built directly onto the metal pads by suitable means (e.g., by stencil printing, doctor blading into a temporary polymer guide (such as a strippable photoresist), by ink jetting, and the like) and are then subsequently surrounded by or interleaved with a suitable dielectric material. Suitable dielectrics contemplated for use herein for the preparation of either of the above-described structures include thermosetting or thermoplastic resins, either filled or unfilled, reinforced or unreinforced. The dielectric may be unmetallized, or metallized on one or both sides to accommodate fabrication of a variety of double and multilayer PWB structures. The blind vias created by either method can have dimensions on the order of 10–2500 $\mu$m. The via-post bearing circuit thus formed can be combined with additional circuits and like structures to produce a multilayer PWB of the desired multiplicity.

In addition to providing vertical interconnection in multilayer PWB's requiring high circuit density, the inventive structures find use in a number of applications. One application of the instant invention is the attachment of high density circuits to lower density circuitry. This construction is useful in instances in which high density is required only in certain areas of a PWB. By adding high density circuitry only where necessary, significant cost reductions and yield gains can be achieved. Because the conductive adhesive compositions employed in the invention are compatible with most circuit metallizations, variations in circuit metallization from layer to layer can be accommodated by the inventive vertical interconnection structures as well.

An additional application is the use of the inventive structures for the attachment of bare die or area array component packages to PWB's. Alternatively, the inventive structures can be employed to electrically interconnect a bare die to its package. Interconnection can be achieved by either placing the bare die or package on a via-post bearing circuit, or by placing the inventive filled perforated dielectric structure between the die, component package or circuit elements to be joined and curing in suitable equipment (e.g., an infrared oven, convection oven, induction heating apparatus, condensation heating, or by other methods well known to those skilled in the art). Use of the inventive structures allows one to complete joining and encapsulation in a single process step.

The invention may be better understood by reference to the following examples which are intended for purposes of illustration and are not to be construed as in any way limiting the scope of the present invention, which is defined in the claims appended hereto.

EXAMPLE 1

A vertical interconnection was made between two layers of copper-clad polyimide. A bond-ply material comprising a sheet of 1-mil polyimide coated on both sides with 1-mil of adhesive (Pyralux bond-ply) was laser drilled with 2, 4, and 6 mil holes. The bond-ply had a protective cover sheet on one side. The transient liquid phase sintering conductive adhesive composition described above was doctor bladed into the bond-ply and processed for 30 minutes at 85° C. to achieve a partial cure. The bond-ply was then placed between the two sheets of copper-clad polyimide and laminated under standard lamination conditions (heat ramp up to 380° F. where it is held for 1 hour).

Cross-sections of the vertical interconnect joints show uniform filling of the vias with the TLPS conductive adhesive composition. The 2, 4, and 6 mil via holes show good fill by the TLPS conductive adhesive and good connection between the circuit layers. The cured composition shows the TLPS metal-alloy network with an interpenetrating polymer network. The cross-section of the via interconnection also shows alloyed connections to the top and bottom circuit layers, providing for stable metallurgical contacts.

EXAMPLE 2

A six-layer circuit was made using three two-layer electrical circuits which were laminated with two interleaved via-patterned bond-ply sheets. The two bond-ply sheets (1 mil of adhesive on both sides of a 2-mil polyimide) were protected with release layers and patterned with 6-mil via holes. The vias were then filled with the TLPS conductive adhesive. No partial cure step was used in this case for the TLPS conductive adhesive prior to lamination thereof. The two-layer flexible circuits had 9-mil pads. The two bond-plies were then aligned between the three two-layer flexible circuits and laminated under standard lamination conditions (heat ramp up to 420° F. where it is held for 1 hour).

A cross-section shows aligned vertical interconnects between the 6-mil filled vias and 9-mil pads. The via interconnects show uniform filling of the via hole and alloyed connections to the top and bottom pads, providing for stable metallurgical contacts in the 6-layer stack.

EXAMPLE 3

A vertical interconnection was made between two layers of copper-clad polyimide. An encapsulating covercoat was deposited on one of the layers and 6-mil holes were introduced into the covercoat by laser. TLPS conductive adhesive described above was stenciled into the encapsulant holes and partially cured for 30 minutes at 85° C. in a convection oven and for 2 minutes at 215° C. in a vapor phase oven. An adhesive was then placed between the copper clad polyimide with TLPS conductive adhesive in the encapsulant holes and another sheet of copper-clad polyimide and laminated under standard lamination conditions.

Cross-sections of the vertical interconnect joints show good conductive adhesive composition fill and connections between the circuit layers.

EXAMPLE 4

A vertical interconnection was made between two layers of copper-clad polyimide. A photoresist was deposited on one of the layers and 5-mil holes were photoimaged in the photoresist. TLPS conductive adhesive was stenciled into the photoresist holes and partially cured. The photoresist was stripped from the copper clad polyimide, leaving posts made of the TLPS conductive adhesive. A perforated bond-ply was then placed between the copper clad polyimide with TLPS conductive adhesive posts and another sheet of copper-clad polyimide and laminated under standard lamination conditions.

Cross-sections of the vertical interconnect joints show good fill by the TLPS conductive adhesive and good connections between the two circuit layers.

EXAMPLE 5

A vertical interconnection was made between two single layer copper circuits on polyimide. A bond-ply sheet (1 mil of adhesive on both sides of a 2-mil polyimide) was protected with release layers and patterned with 6-mil via holes. The vias were then filled with the TLPS conductive adhesive. No partial curing step was used in this case for the TLPS conductive adhesive. The two single-sided flexible circuits had 9-mil pads. The bond-ply was then placed between the two flexible circuits and all three layers were aligned. Standard lamination was performed (heat ramp up to 420° F.).

Electrical resistivity was measured for individual vertical connections and resistances of less than 10 mΩ were measured. A cross-section shows uniform filling of the via hole and alloyed connections to the top and bottom pads, providing for stable metallurgical contacts. Environmental testing consisting of 100 thermal shock cycles between −50° C. and +150° C. showed less than 10% change in resistance.

EXAMPLE 6

A vertical interconnection was made between two single layer copper circuits on polyimide. A TLPS conductive adhesive was stenciled on 9-mil pads on both circuits using a stencil with 8-mil holes. The TLPS conductive adhesive posts were then partially cured. A bond-ply material comprising a sheet of 1-mil polyimide coated on both sides with 2-mil of adhesive was laser drilled with clearance holes. The bond-ply was then placed between the two sheets of copper-clad polyimide and all three layers were aligned. Standard lamination was performed (heat ramp up to 420° F.).

Electrical resistivity was measured for individual vertical connections and resistances of less than 100 mΩ were typically measured.

EXAMPLE 7

A vertical interconnection was made between a two-layer high density flexible circuit and a two layer low density printed circuit board. A TLPS conductive adhesive was stenciled on the 50 mil diameter plated pads of the flexible circuit. The TLPS conductive adhesive posts were then partially cured. A bond-ply material with clearance holes was then placed between the high density flexible circuit and the low density printed circuit board and the three were laminated. Standard lamination was performed.

Electrical connections were tested and resistances measured were less than 0.1 Ω. Cross-sections indicate metallurgical connections between the TLPS conductive adhesive and the copper pads.

EXAMPLE 8

A vertical interconnection was made between a copper component and a tin-lead plated copper pad on a printed circuit board substrate. Electrical connection between the attachment pad and the measurement pad on the circuit board was measured at 15 mΩ. A bond-ply sheet (1 mil of adhesive on both sides of a 2-mil polyimide) with release layers was drilled with 62.5 mil via hole. A TLPS conductive adhesive was applied into the via hole. The bond-ply was then aligned between the component and a pad on the printed circuit board. A reflow cycle using a lamp IR station was used to heat the assembly. The total cycle was 280 seconds with a peak temperature of 260° C.

Electrical resistance between the copper component and the measurement pad on the printed wiring board was measured at 20 mΩ, indicating a via connection resistance of 5 mΩ. A post cure of the adhesive bond-ply was done at 210° C. for 40 minutes. Via connection resistance following the post-cure again measured 5 mΩ.

While the invention has been described in detail with reference to certain preferred embodiments thereof, it will be understood that modifications and variations are within the spirit and scope of that which is described and claimed.

That which is claimed is:

1. A specialty vertical interconnection assembly (via) structure, said structure comprising:
   (i) a dielectric material that is perforated in a desired geometry and pattern so as to form one or more vertical interconnection pathways; and
   (ii) an electrically conductive transient-liquid-phase sintering (TLPS) composition filled into the vertical interconnection pathways in the perforated dielectric, said electrically conductive TLPS composition comprising:
   5–65% by volume of a high melting point metal,
   5–60% by volume of a low melting point metal or metal alloy,
   0–35% by volume of a binder,
   2–60% by volume of a latent or chemically protected, crosslinking agent,
   0–35% by volume of a reactive monomer or polymer, and
   0–10% by volume of a metal additive,
   provided, however, that said composition must contain either said binder and/or said reactive monomer or polymer, or, in the alternative, said binder and/or said reactive monomer or polymer can be combined with said chemically protected crosslinking agent to produce a single component of said composition.

2. A structure according to claim 1 wherein one side of said perforated dielectric is metallized.

3. A structure according to claim 1 wherein both sides of said perforated dielectric are metallized.

4. A structure according to claim 1 further comprising two double sided printed wiring boards laminated on either side of said specialty via structure to create a multilayer circuit.

5. A structure according to claim 1 further comprising two multilayer printed wiring boards laminated on either side of said specialty via structure to create a multilayer printed wiring board.

6. A structure according to claim 1 further comprising an area array component package and a printed wiring board substrate wherein said area array component package and said printed wiring board substrate are aligned and connected on either side by said specialty via structure to create an assembled printed wiring board.

7. A structure according to claim 1 further comprising a bare die and a printed wiring board substrate wherein said die and said printed wiring board substrate are aligned and connected on either side by said specialty via structure to create an assembled printed wiring board.

8. A structure according to claim 1 further comprising a bare die and a component package wherein said die and said component package are aligned and connected on either side by said specialty via structure to create a packaged component.

9. A specialty via interconnect structure comprising:
   (i) an encapsulated metallized dielectric, wherein the encapsulant has been selectively removed from the metallized surface in a desired pattern, and
   (ii) via-posts formed from an electrically conductive composition within said encapsulant whereby said composition is electrically interconnected to said metallized surface, and wherein the electrically conductive composition comprises:
   5–65% by volume of a high melting point metal,
   5–60% by volume of a low melting point metal or metal alloy,
   0–35% by volume of a binder,
   2–60% by volume of a latent or chemically protected, cross-linking agent,
   0–35% by volume of a reactive monomer or polymer, and
   0–10% by volume of a metal additive,
   provided, however, that said composition must contain either said binder and/or said reactive monomer or polymer, or, in the alternative, said binder and/or said reactive monomer or polymer can be combined with said chemically protected crosslinking agent to produce a single component of said composition.

10. A structure according to claim 9 wherein said metallized surface is a printed wiring board circuit pad.

11. A structure according to claim 9 wherein said metallized surface is a circuit pad on an area array component package.

12. A structure according to claim 9 wherein said metallized surface is a circuit pad on a bare die.

13. A structure according to claim 9 further comprising a printed wiring board wherein said printed wiring board is laminated on top of said specialty via structure such that circuit pads on said printed wiring board are connected to the vias in said via structure to create a multilayer printed wiring board.

14. A structure according to claim 9 further comprising an area array component package wherein said area array component package is attached on top of said specialty via structure such that circuit pads on said package are connected to the vias in said via structure to create a printed wiring board assembly.

15. A structure according to claim 9 further comprising a bare die wherein said die is attached on top of said specialty via structure such that circuit pads on said die are connected to the vias in said via structure to create a printed wiring board assembly.

16. A structure according to claim 9 further comprising a bare die wherein said die is attached on top of said specialty via structure such that circuit pads on said die are connected to the vias in said via structure to create an assembled component package.

17. A specialty vertical interconnection assembly (via) structure comprising:
(i) a metallized dielectric, and
(ii) conductive adhesive posts, formed from an electrically conductive adhesive composition, in contact with said metallized dielectric in a desired via configuration, wherein the conductive adhesive composition comprises:
5–65% by volume of a high melting point metal,
5–60% by volume of a low melting point metal or metal alloy,
0–35% by volume of a resin,
2–60% by volume of a chemically protected, cross-linking agent,
0–35% by volume of a reactive monomer or polymer, and
0–10% by volume of a metal additive,
provided, however, that said composition must contain either said binder and/or said reactive monomer or polymer, or, in the alternative, said binder and/or said reactive monomer or polymer can be combined with said chemically protected crosslinking agent to produce a single component of said composition.

18. A structure according to claim 17 wherein said metallized dielectric is a PWB circuit pad.

19. A structure according to claim 17 wherein said metallized dielectric is a circuit pad on an area array component package.

20. A structure according to claim 17 wherein said metallized dielectric is a circuit pad on a bare die.

21. A structure according to claim 17 further comprising:
(i) a dielectric adhesive pierced by said via posts, and
(ii) a printed wiring board,
wherein said adhesive and said printed wiring board are laminated on top of said specialty via structure such that circuit pads on said printed wiring board are connected to the vias in said via structure to create a multilayer circuit.

22. A structure according to claim 17 further comprising:
(i) a dielectric adhesive pierced by said via posts, and
(ii) an area array component package,
wherein said adhesive and said area array component package are attached on top of said specialty via structure such that circuit pads on said package are connected to the vias in said via structure to create a printed wiring board assembly.

23. A structure according to claim 17 further comprising:
(i) a dielectric adhesive pierced by said via posts, and
(ii) a bare die,
wherein said adhesive and said die are attached on top of said specialty via structure such that circuit pads on said die are connected to the vias in said via structure to create a printed wiring board assembly.

24. A structure according to claim 17 further comprising:
(i) a dielectric adhesive pierced by said via posts, and
(ii) a bare die,
wherein said adhesive and said die are attached on top of said specialty via structure such that circuit pads on said die are connected to the vias in said via structure to create a packaged component.

* * * * *

UNITED STATES PATENT AND TRADEMARK OFFICE
CERTIFICATE OF CORRECTION

PATENT NO. : 5,948,533
DATED : September 7, 1999
INVENTOR(S) : Gallagher et al.

It is certified that error appears in the above-identified patent and that said Letters Patent is hereby corrected as shown below:

Column 1,
Line 23, please insert the following new heading and paragraph:
-- ACKNOWLEDGEMENT
     This invention was made with Government support under DAAH01-96-C-R020 awarded by the U.S. Army Aviation and Missile Command. The Government has certain rights in this invention. --

Signed and Sealed this

Twenty-sixth Day of March, 2002

Attest:

*Attesting Officer*

JAMES E. ROGAN
*Director of the United States Patent and Trademark Office*